United States Patent
Misic

(10) Patent No.: US 7,508,214 B2
(45) Date of Patent: Mar. 24, 2009

(54) TRANSMIT-MODE PHASED ARRAY COILS FOR REDUCED SAR AND ARTIFACT ISSUES

(75) Inventor: George J. Misic, Allison Park, PA (US)

(73) Assignee: Medrad, Inc., Indianola, PA (US)

( * ) Notice: Subject to any disclaimer, the term of this patent is extended or adjusted under 35 U.S.C. 154(b) by 11 days.

(21) Appl. No.: 11/751,115

(22) Filed: May 21, 2007

(65) Prior Publication Data

US 2008/0290870 A1 Nov. 27, 2008

(51) Int. Cl.
*G01V 3/00* (2006.01)

(52) U.S. Cl. ........................ 324/322; 324/318

(58) Field of Classification Search ......... 324/300–322; 600/407–422
See application file for complete search history.

(56) References Cited

U.S. PATENT DOCUMENTS

| | | | |
|---|---|---|---|
| 4,793,356 A * | 12/1988 | Misic et al. ................ | 600/422 |
| 4,825,162 A | 4/1989 | Roemer et al. | |
| 6,040,697 A | 3/2000 | Misic | |
| 6,223,065 B1 * | 4/2001 | Misic et al. ................ | 600/410 |
| 6,396,273 B2 | 5/2002 | Misic | |
| 6,714,013 B2 | 3/2004 | Misic | |
| 6,747,454 B2 | 6/2004 | Belt | |
| 6,828,790 B2 | 12/2004 | Katscher et al. | |
| 6,844,732 B2 * | 1/2005 | Carlini et al. .............. | 324/318 |
| 6,900,636 B2 | 5/2005 | Leussler | |
| 6,940,282 B2 | 9/2005 | Dumoulin et al. | |
| 6,946,840 B1 | 9/2005 | Zou et al. | |
| 6,989,673 B2 | 1/2006 | Zhu | |
| 6,990,223 B2 * | 1/2006 | Ma et al. .................... | 382/131 |
| 7,012,430 B2 | 3/2006 | Misic | |
| 7,053,618 B2 | 5/2006 | Zhu | |
| 7,075,302 B2 | 7/2006 | Zhu | |
| 7,183,770 B2 * | 2/2007 | Graβlin et al. ............. | 324/322 |
| 7,218,109 B2 | 5/2007 | Campagna | |
| 7,221,160 B2 * | 5/2007 | Leussler et al. ............ | 324/318 |
| 7,221,162 B2 | 5/2007 | Feiweier et al. | |
| 7,242,193 B2 | 7/2007 | Feiweier | |
| 7,253,621 B2 | 8/2007 | Steen et al. | |
| 2005/0152657 A1 | 7/2005 | Suetsugu et al. | |
| 2005/0174116 A1 | 8/2005 | Leussler et al. | |
| 2006/0013213 A1 | 1/2006 | Takahashi | |

FOREIGN PATENT DOCUMENTS

JP 2005152655 6/2005

(Continued)

*Primary Examiner*—Brij B Shrivastav
(74) *Attorney, Agent, or Firm*—James R. Stevenson

(57) ABSTRACT

Systems and methods for the selection of and application of RF power to a plurality of transmit and/or transmit/receive coil elements to decrease patient SAR and to limit the potential for artifact problems. Without any change to the hardware or software of an MR scanner, the present local coil system provides system logic and coil design flexibility such that only transmit coil elements that are required for a particular portion of an MR scan will be utilized at that time. The local coil system may include any combination of transmit-only, receive-only and transmit/receive coil elements as part of the coil system (array of coil elements). The logic controller of the local coil system gathers input data from the MR scanner, from the attached coil elements and optionally from one or more sensors attached to the coil system itself.

34 Claims, 8 Drawing Sheets

FOREIGN PATENT DOCUMENTS

| | | |
|---|---|---|
| JP | 2006158762 | 6/2006 |
| WO | 2004053514 | 6/2004 |
| WO | 2004061469 | 7/2004 |
| WO | 2005043182 | 5/2005 |
| WO | 2005010146 | 10/2005 |
| WO | 2006016292 | 2/2006 |
| WO | 2006033047 | 3/2006 |
| WO | 2006067727 | 6/2006 |
| WO | 2006117714 | 11/2006 |
| WO | 2007042951 | 4/2007 |

* cited by examiner

TRANSMIT-MODE PHASED ARRAY COILS FOR REDUCED SAR AND ARTIFACT ISSUES

BACKGROUND OF THE INVENTION

1. Field of the Invention

The present invention generally relates to magnetic resonance imaging ("MR" or "MRI") and, more particularly, to devices and methods for selectively enabling transmit and transmit/receive RF coil elements for use with an MRI host device.

2. Description of the Background

MRI systems, and the coils for use therewith, have changed dramatically since the inception of the science in the 1970's. As MR scanners become more powerful and have stronger magnetic fields, the RF coils used to transmit RF signals to the patient and receive a response therefrom have become more precise and better able to achieve a variety of different scan modes. In the use of RF coils, there is a continual tension between transmission power, reception fidelity and a wide range of electromechanical problems (e.g., image artifacts and heightened patient specific absorption rate (SAR) levels).

Initially, MRI systems used large, whole body coils to image subjects, such as human patients. The whole body receive coils of these systems had the advantage that sensitivity was, to a first approximation, substantially constant over the entire region being imaged. While this uniformity in sensitivity was not strictly characteristic of such whole body receive coils, the sensitivity was substantially constant to a degree that most reconstruction techniques assumed a constant coil sensitivity. Due to their large volume, however, whole body receive coils suffer from a relative insensitivity to individual spins.

For certain applications, a local coil (either a surface coil or volume coil which fit more closely to a patient's body part to be imaged) may be preferable to a whole body receive coil in MRI systems. An example of a surface receive coil is described in U.S. Pat. No. 4,793,356 to Misic et al. Surface coils can be made much smaller in geometry than whole body receive coils, and for medical diagnostic use they can be applied near, on or inside the body of a patient. This is especially important where attention is directed to imaging a small region within the patient rather than an entire anatomical cross-section. The use of a surface coil in MRI systems also reduces the noise contribution from electrical losses in the body in comparison to a corresponding whole body receive coil, while maximizing the desired signal. MRI systems thus typically use small local coils (surface or volume) for localized high resolution imaging.

A disadvantage of local coils, especially local surface coils, however, is their limited reception area or field of view (FOV). For example, a single surface coil can only effectively image a region of a subject having lateral dimensions comparable to the surface coil diameter. Therefore, surface coils necessarily restrict the field of view, and inevitably lead to a tradeoff between the resolution of the gathered data (and the resulting image) and the field of view. Generally, large surface coils generate more noise due to their exposure to greater patient sample losses and therefore have a larger noise component relative to the signal, while smaller coils have lower noise but in turn restrict the field of view to a smaller region.

One popular technique that was developed to extend the field of view limitation in local coils (in this case local surface coils) is described in U.S. Pat. No. 4,825,162 entitled "Nuclear Magnetic Resonance (NMR) Imaging with Multiple Surface Coils" and is generally referred to as "phased array." The '162 patent describes a set of surface coils arrayed with overlapping fields of view. Each of the local surface coils is positioned to have substantially no interaction with any adjacent surface coils (or, more appropriately, the interaction of all of the coils on each other sum to zero). A different response signal is received at each different surface coil from an associated portion of the sample that was enclosed within an imaging volume defined by the array. Each different response signal is used to construct a different one of a like plurality of different images of the sample. The different images are then combined to produce a single composite image of the sample.

In much the same way, the transmission of RF power to a patient's body has caused similar problems in the art. Typically, during a scan procedure, the operator intends to image only a small subpart of the total volume of a patient's body that resides within the bore of the MR scanner. For example, although virtually all of the patient's body may be located within the scanner bore, the operator may only be interested in receiving image data from the patient's left leg. This "intended" portion of the patient (or other object being scanned) is generally referred to as the region of interest "ROI" of the patient.

Any RF power that is transmitted to an area of the patient other than the intended region of interest is wasted (at least) and may cause problems for the patient or the resulting image of the patient. For example, if the left leg is the region of interest, but RF power is applied to the right leg as well as the left leg (e.g., using a whole body coil as the transmitter), the receiver may pick up "artifacts" reflecting off of the right leg. The artifacts may appear similar to "ghost" lines on a television. Moreover, although MRI procedures are extremely safe, it may not always be preferred to send RF power into non-ROI portions of a patient (increased SAR).

To address the foregoing issues, in a similar fashion as with the receive coils discussed above, transmit coils (or transmit coil elements) have also gone through a progression of change through the years. In the early stages of MRI, large, whole body coils were used to transmit RF power to patients, and these whole body coils sent RF power to all portions of the patient within the MR scanner bore. Later, smaller "local" transmit coils were used to transmit RF only to a specific region of the patient within the scanner. Finally, coils capable of selectively switching between transmit and receive modes (T/R coils) were used to address these concerns. Each of these methods improved the artifact and SAR issues, but additional improvement is continually sought.

As phased array receive coils gain popularity, it has been noted that not all of the coil elements that make up the array are necessary for each portion of a scan. For example, as a succession of axial image slices is taken down the longitudinal axis of an RF coil, different coil elements are utilized. Devices and methods to allow for the selection of only some of the plurality of coil elements in an array coil system at different times during a scan have been suggested, but no acceptable solution to this problem has heretofore been provided.

Specifically, in the past, systems and devices have been proposed which dramatically alter the hardware and functionality of the host MR system (i.e., the MR scanner or suite) to control delivery of RF power and the temporal selection of coil elements. For example, non-U.S. patent application number WO2005043182 entitled "B1 Field Control in Magnetic Resonance Imaging" includes one such prior system in which the entire coil interface of the scanner has been redesigned. These prior systems are not useful across a wide variety of existing MR scanners and instead require a specifically-designed scanner for operation. Embodiments of the present invention provide a coil-based device that achieves an intelligent transmit-mode without the need to redesign the coil interface of the MR scanner.

Some companion concepts have recently been introduced into the MR arts. For example, U.S. Pat. No. 6,223,065 to Misic entitled "Automatic Coil Element Selection in Large MRI Coil Arrays" (hereafter "the '065 patent") includes sensors and logic that detect and alert an intelligent RF coil as to the position of the coil within the bore and as to the identification of the slice being imaged at any given time. It has been contemplated that such sensors/logic can be used to select various receive coil elements so that only elements that are needed to image a specific portion of the current region of interest are activated at any one time. General concepts as introduced above may be incorporated into various embodiments of the present invention.

SUMMARY OF THE INVENTION

In accordance with at least one preferred embodiment, the present invention provides systems and methods for a coil system utilizing intelligent transmit mode phased array coil elements. Based on a variety of different inputs from an MR scanner or external sensors, the coil system automatically selects appropriate transmit (and receive) coil elements from a plurality of existing coil elements in order to supply RF power from the MR scanner to only those transmit coil elements that are required for a particular scan or mode (or portion of a scan). The system reduces SAR, prevents many potential artifact problems and provides a more uniform RF transmit field because power is only applied where needed.

In at least one embodiment, the coil system of the present invention is specifically designed to interact with a wide variety of existing and future MR scanners without the need to change the hardware or software on those scanners. The coil system includes a variety of different coil elements arranged in an array, and the individual coil elements may be transmit-only, receive-only or transmit/receive (T/R) coil elements. In addition to the coil elements themselves, the present invention may also include a logic controller that receives signals from the scanner, coil elements and/or external sensors and is able to determine the appropriate coil elements to which to apply RF power at any given time.

Depending on the number of transmit and receive coil elements and the capabilities of the MR scanner, the coil system of an embodiment of the present invention may also include a transmit multiplexer and/or a receive multiplexer. The transmit multiplexer splits the incoming RF power from the MR scanner so that it may be applied to more than one transmit coil element. A receive multiplexer allows a number of receive coil elements that is greater than the number of receivers available on the scanner to be connected to the scanner. Both the transmit multiplexer and the receive multiplexer may be operated by a logic controller.

The inputs to the logic controller that aid in the selection of appropriate transmit coil elements may come from the scanner and/or an external sensor. For example, the selection of a specific "Coil Name" in the configuration file within the scanner may trigger the sending of information from the scanner to the coil system sufficient to identify those coil elements that are needed for a particular scan mode. This information may be sent over existing data lines on the scanner interface such as the T/R bias lines or multiplexer select lines. Additionally or alternatively, one or more sensors attached to the coil system that are capable of sensing changes in the B1 and/or B0 field strength may be used to determine the position of the coil system with respect to isocenter and, therefore, allow the logic controller to select appropriate transmit coil elements located at isocenter. In all, a wide variety of different features and functionalities may be employed through the use of embodiments of the present invention.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

Figure 1:
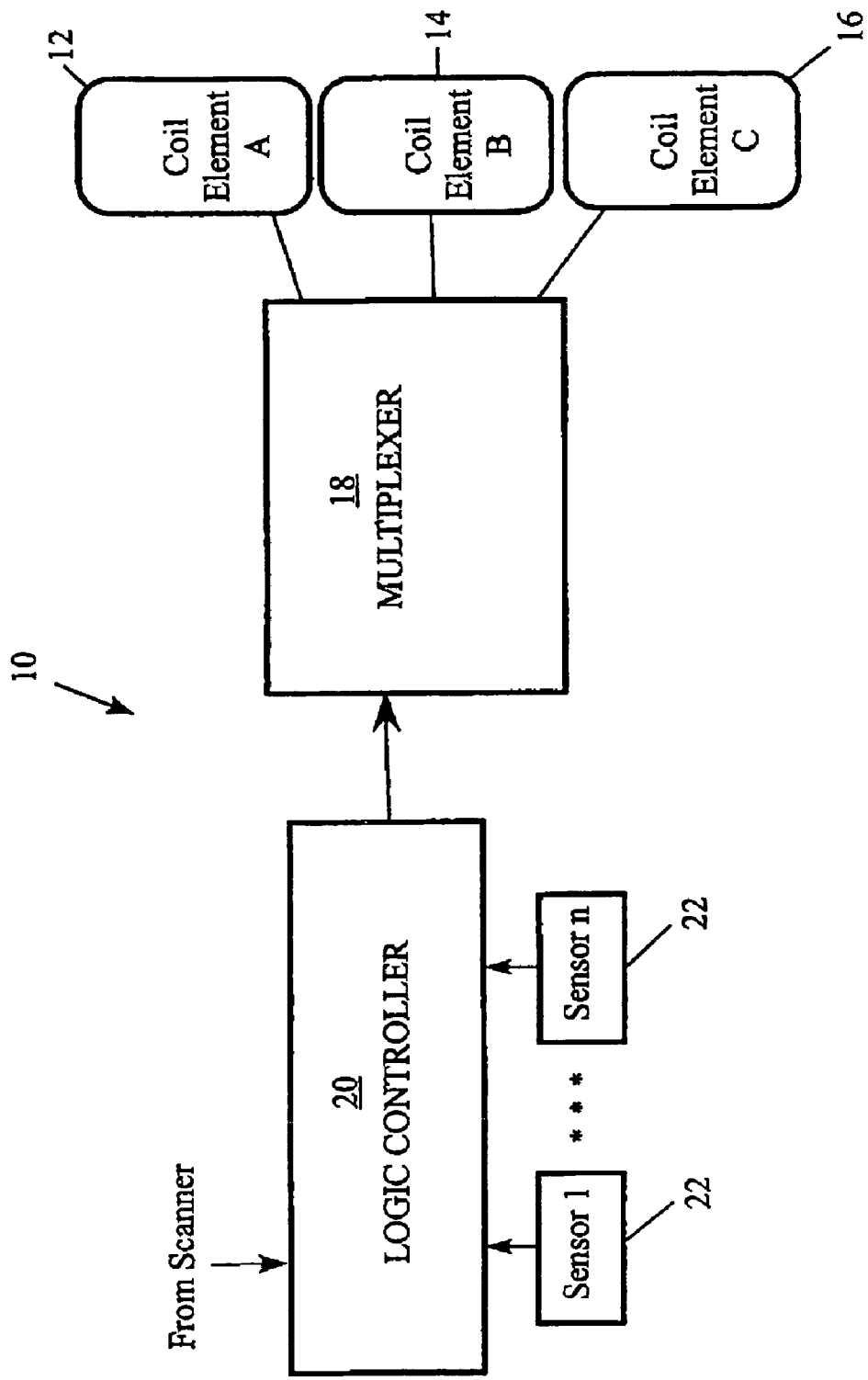
FIG. 1 is a high level block diagram of the components on the transmit side of a coil system according to an embodiment of the present invention.

It is to be understood that the figures and descriptions of the present invention have been simplified to illustrate elements that are relevant for a clear understanding of the invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

The present invention, in at least one embodiment, provides for the use of a group of coil elements in an array fashion for the transmit-mode excitation of the spin systems during MR imaging and/or spectroscopy. The transmit coil system comprises a number of coil elements with each element covering a portion of the region of interest (ROI) or field of view (FOV). According to embodiments of the present invention, the system body coil is not utilized for RF transmission for spin excitation as is commonly done with receive-only coils. Instead, the transmit coil system supplies the excitation only to those coil elements that are needed to image the particular slice or slab being excited at any given time during the scanning process.

In an example, an array of coil elements includes three distinct coil elements (TXA, TXB, and TXC). In a twenty slice acquisition in which five of the slices are within the coverage of the first transmit coil element TXA, the second eight slices is within the coverage of the second transmit coil elements TXB, and the third group of seven slices are within the coverage region of the third transmit coil element TXC, transmission is done only by the relevant transmit coil element as the excitation for each slice (or slab) is applied. In some scans (e.g., a progression of axial scans), the coil elements may be used one after the other as the scan moves down the region of interest. In other scans (e.g., a coronal scan of a body part that resides within TXA and TXB), two of the coil elements may be used at all times while the third coil element is not used at all. It is this flexibility that provides one of the key advantages of the intelligent transmit mode of various embodiments of the present invention.

As a result of the present coil system and associated methods, a much smaller portion of the patient's tissue is exposed to RF power, because three smaller coils are now illuminating only the slices that need to be excited during the imaging period. In contrast, if the system body coil were used for transmit excitation, the entire field of view or region of interest in question, plus, in most cases, a considerable area outside of the region being scanned would all be receiving RF power. With the use of the present invention, only the specific slices or slabs being imaged (or producing spectra) at any given instant would be receiving RF power. Because the transmit-mode coils of the present invention may be more closely fitted to the patient's anatomy than a general purpose system body coil, additional savings in SAR and added freedom from aliasing and Annefact issues occur. In the above example, the SAR may be reduced by at least 50%, depending upon the specifics of the situation and coil element structure.

A high-level block diagram of the components of the transmit side coil system 10 according to an embodiment of the present invention is shown in FIG. 1. As seen in FIG. 1, the exemplary array of coil elements is comprised of three separate transmit coil elements: transmit coil element A 12; transmit coil element B 14; and transmit coil element C 16. Each of these transmit coil elements 12, 14, 16 may cover a different physical portion of the person to be scanned, but certain portions of the coil elements 12, 14, 16 may be overlapped with each other in order to facilitate phased array reception or other MRI functionalities. Depending on the intended scan, one or more of the coil elements 12, 14, 16 may be used as a transmitter at any given time. The coil elements 12, 14, 16 may be overlapping or non-overlapping coils. An example of the coil elements 12, 14, 16 may be found in U.S. Pat. No. 6,747,454 to Belt entitled "Array of Coils for use in Imaging the Vasculature of a Patient" (hereafter "the '454 patent"). The '454 patent is co-owned with the present application and is incorporated by reference in its entirety as if set forth within this specification.

Figure 2A:
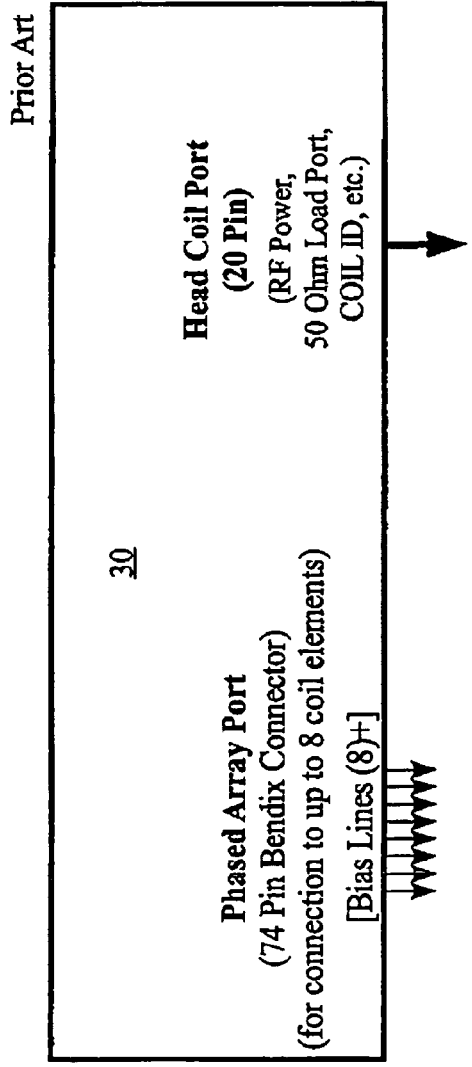
FIGS. 2A and 2B show signal lines for exemplary MR scanner ports, e.g., a legacy coil port typical of older GE Signa systems (level 11 and earlier) and a coil port A for a newer GE Signa system (level 14)
Figure 2B:
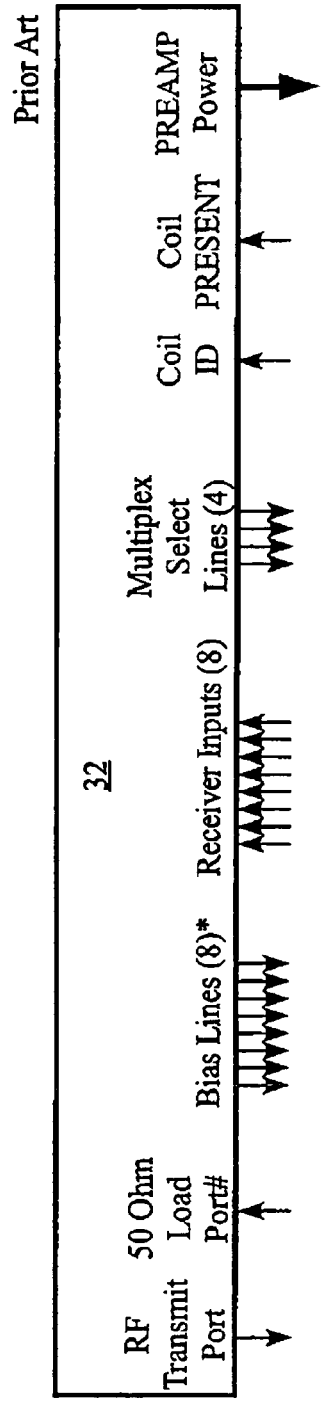

The RF power that is ultimately applied to the coil elements 12, 14, 16 (either one at a time or in groups of coil elements) emanates from the transmitter port of an MR scanner (not shown). Depending on the number of transmitter ports available on the scanner as well as the number of coil elements 12, 14, 16 that require power, the use of a multiplexer 18 may be employed to provide RF power to a larger number of transmit coil elements than the number of available transmitter ports on the scanner. For example, in the coil system of FIG. 1, power from a single transmitter port, such as those shown in FIGS. 2A and 2B, is multiplexed to coil element A 12, coil element B 14 and/or coil element C 16.

A logic controller 20 determines how power is applied from the scanner's transmitter port to the one or more coil elements 12, 14, 16. For example, during some scans, the three coil elements 12, 14, 16 may be powered one after another, and during other scans, two or more coil elements 12, 14, 16 may be provided with RF power simultaneously (for at least part of the scan process). The logic controller 20 includes the processing power necessary to make the determination of which coil element 12, 14, 16 receives RF power at any particular time based on one or more different sources of input. For example, one or more control lines available on the scanner may be used to provide either one-time or real-time identification of the coil elements 12, 14, 16 that require power. For one time control, the operator would select a certain coil type (i.e., "Coil Name" in the coil configuration file of the scanner) and this information would cause the logic controller 20 to use a look-up table to determine coil element power progression. However, if the scanner includes an available dedicated control line, this line may be used in real time to direct the logic controller 20 as to the order/timing of power application to the coil elements 12, 14, 16. Examples of such a dedicated control line include one or more of the multiplex select lines shown in FIG. 2B. In various embodiments, the logic controller is constructed of hardware, software, firmware, or any combination thereof, and may be implemented as a rules-based system.

In various embodiments, sensors 22 placed within the scanning system may be used by the logic controller 20 to determine which of the coil elements (e.g., Coil Element A 12, Coil Element B 14 and/or Coil Element C 16) should be powered at any given time. For example, in many scanners, the table upon which the patient lays during the scan is moved longitudinally in and out of the scanner during the scanning process in order to keep the portion of the patient being scanned at the isocenter (i.e., electromagnetic center) of the scanner. By tracking the position of the table with respect to isocenter, the logic controller 20 can apply power to appropriate transmit coil elements 12, 14, 16 that are at or near isocenter.

Likewise, in various embodiments, at least one of the sensors 22 may be a sensor that may be used to determine to which coil elements 12, 14, 16 RF power should be applied. For example, during a progression of axial scans, the amplitude of the gradient coils represents an offset from isocenter, and a frequency sensor could be used to detect the offset and the logic controller 20 could then power the appropriate transmit coil element(s). U.S. Pat. No. 6,223,065 (hereafter "the '065 patent") discloses various methods for using various position sensors to accomplish the above-defined task for use with receive coil elements. The '065 patent is co-owned with the present application and is incorporated by reference in its entirety as if set forth within this specification.

Embodiments of the present invention may be used with a wide range of RF coils and arrays of coil elements, including both transmit-only coils and transmit/receive ("T/R") coils. The coil system 10 described herein may account for the varied types of physical and communicative interactions with different scanners. For example, FIGS. 2A and 2B provide block diagrams of interface connectors 30, 32 for various scanners. As both the physical layout and the manipulation of the communications and power signals differ between different scanners, the flexibility of the present invention will be described with respect to the two exemplary scanner interfaces (connectors) 30, 32. However, it can be understood that various embodiments of the present invention may be used with any type of existing and future scanner.

FIG. 2A is a block diagram of an interface connector 30 on a legacy GEHC Signa scanner (level 11 and earlier). In the legacy system, the interface connector 30 is a 74-pin Bendix surface coil port and a 20-pin Bendix head coil port. The 74-pin Bendix connector 30 is the phased array port on the scanner which provides for connection of up to 8 different coil elements. It includes 8 (or more) bias lines that are individually capable of being switched between receive and transmit modes or to stay in the transmit mode (depending on what type of coil element is attached thereto). Depending on the specific coil to be used (identified by the operator as a "Coil Name" in the scanner configuration file), the voltages on the bias lines will be applied in a different pattern. On GE Excite systems and earlier versions of such MR scanners, each bias line is capable of being operated at −5VDC, +3VDC, +5VDC and +7VDC to implement a coil-specific biasing pattern. According to embodiments of the present invention, the bias lines can be used to send a control signal to the logic controller 20 of the coil system 10.

In the legacy interface connector 30 of FIG. 2A, the head coil port (20 pin connector) is used to transmit the RF power to the coil system and to provide a 50 ohm load port, COIL ID and other signals between the coil system 10 and the scanner. Likewise, other earlier GE systems used a 30-pin Bendix connector employing 4 bias lines. However, such older scanners are equally applicable to the features of the system as described herein.

FIG. 2B is a block diagram of an interface connector 32 on a later model GE Healthcare Signa system (level 14). In the GE Signa system (level 14) of FIG. 2B, the interface connector 32 is designated as COIL PORT A, and it largely replicates the functions included in the 74-pin Bendix surface coil port and the 20-pin Bendix head coil port on the legacy system connector 30 described above with respect to FIG. 2A.

As shown in FIG. 2B, coil port A includes a variety of different signals, including: an RF Transmit Port out to the coil; a 50 Ohm Load Port which can be used to dissipate excess/reflected RF power that is provided to the local coil; bias lines; receiver inputs; multiplex select lines; COIL ID and COIL PRESENT signals from the coil to the scanner; and PREAMP power signals out to the coil.

One aspect of this more advanced coil port A structure of the connector 32 is the multiplex select lines. Each of the four exemplary multiplex select lines can have a high logic level or a low logic level. Through these lines, the scanner sends a 4-bit logic pattern to the coil to which it is connected. The 4-bit signal can be used to convey a variety of different information such as: (i) how large the field of view will be; and (ii) which part of the coil will be on (e.g., for a neurovascular array ("NVA"), the head coil, anterior neck coil and/or posterior neck coil will be utilized). Ultimately, the select lines provide a means to communicate desired information to the local coil.

Figure 3:
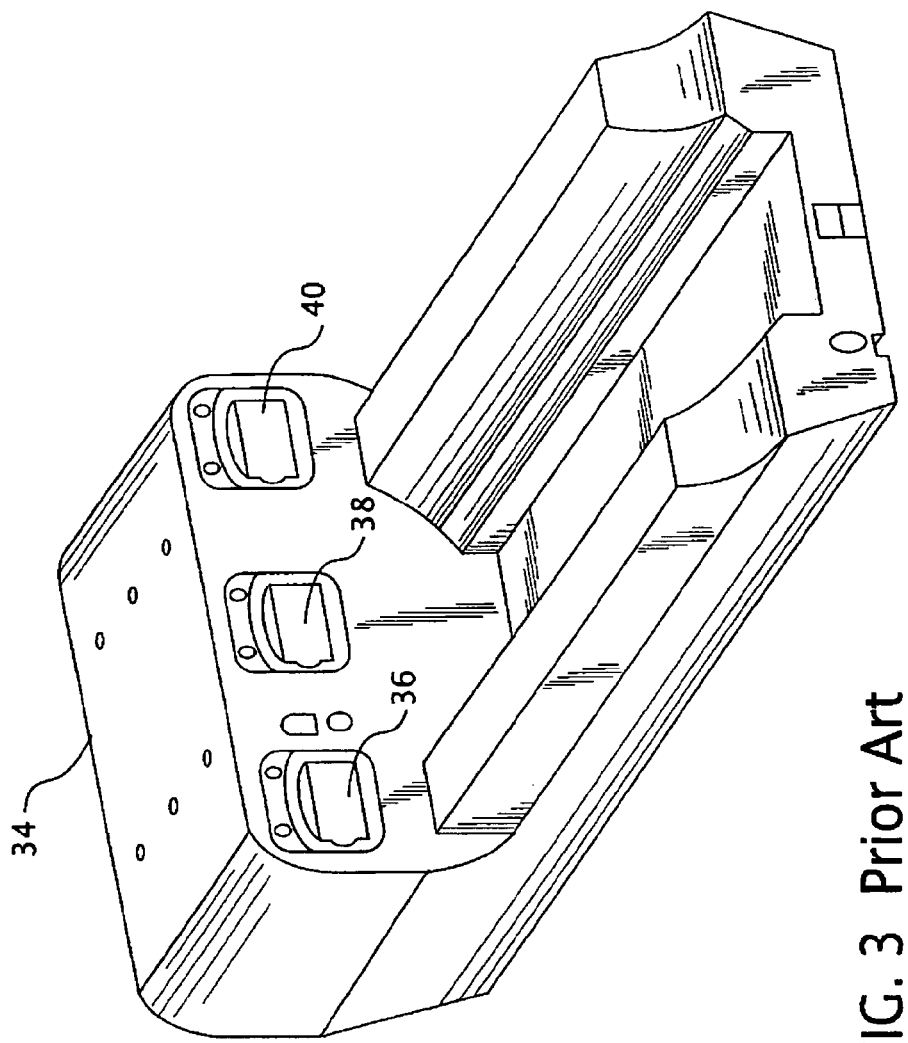
FIG. 3 shows a carriage assembly equipped with three different types of coil ports, e.g., coil ports A, B and C for a GE Signa system (level 14)

As further background on the variety of existing MR scanner interfaces, FIG. 3 shows an exemplary carriage assembly 34 for a scanner system. The carriage assembly 34 houses the electronics into which a local coil (such as the coils 12, 14, 16 of FIG. 1) is plugged via one or more coil ports 36, 38, 40. Depending on the particular scanner system in use, the carriage assembly 34 may include one, two or three different coil port interfaces. The example of FIG. 3 includes interfaces to three different coil ports: coil port C 36, coil port A 38 and coil port B 40.

In FIG. 3, coil port C 36 is comprised of 16 receivers and is intended for connection to large arrays of coil elements. A coil port such as coil port C 36 is found on more advanced MR scanners.

In FIG. 3, coil port B 40 is comprised of 16 receivers and associated bias lines and support lines. Certain support lines provide power to preamplifier-equipped coil elements. Other support lines are used to provide the scanner with COIL ID information and COIL PRESENT information. Various other support lines can provide signals from the scanner to the coil and from the coil to the scanner. These lines can be used by the logic controller 20 to selectively apply power to one or more transmit coil elements 12, 14, 16 by, for example, manipulating the flow of RF power from the scanner through the transmit multiplexer 18.

In FIG. 3, coil port A 38 is comprised of one transmit port and one 50 ohm load port, which can be used with the transmit port. Coil port A 38 also has up to 16 receive ports. The port may also have bias lines, the COIL ID lines, the COIL PRESENT lines and also the multiplex select lines. In the following description, coil port A 38 is used throughout the example.

Figure 4:
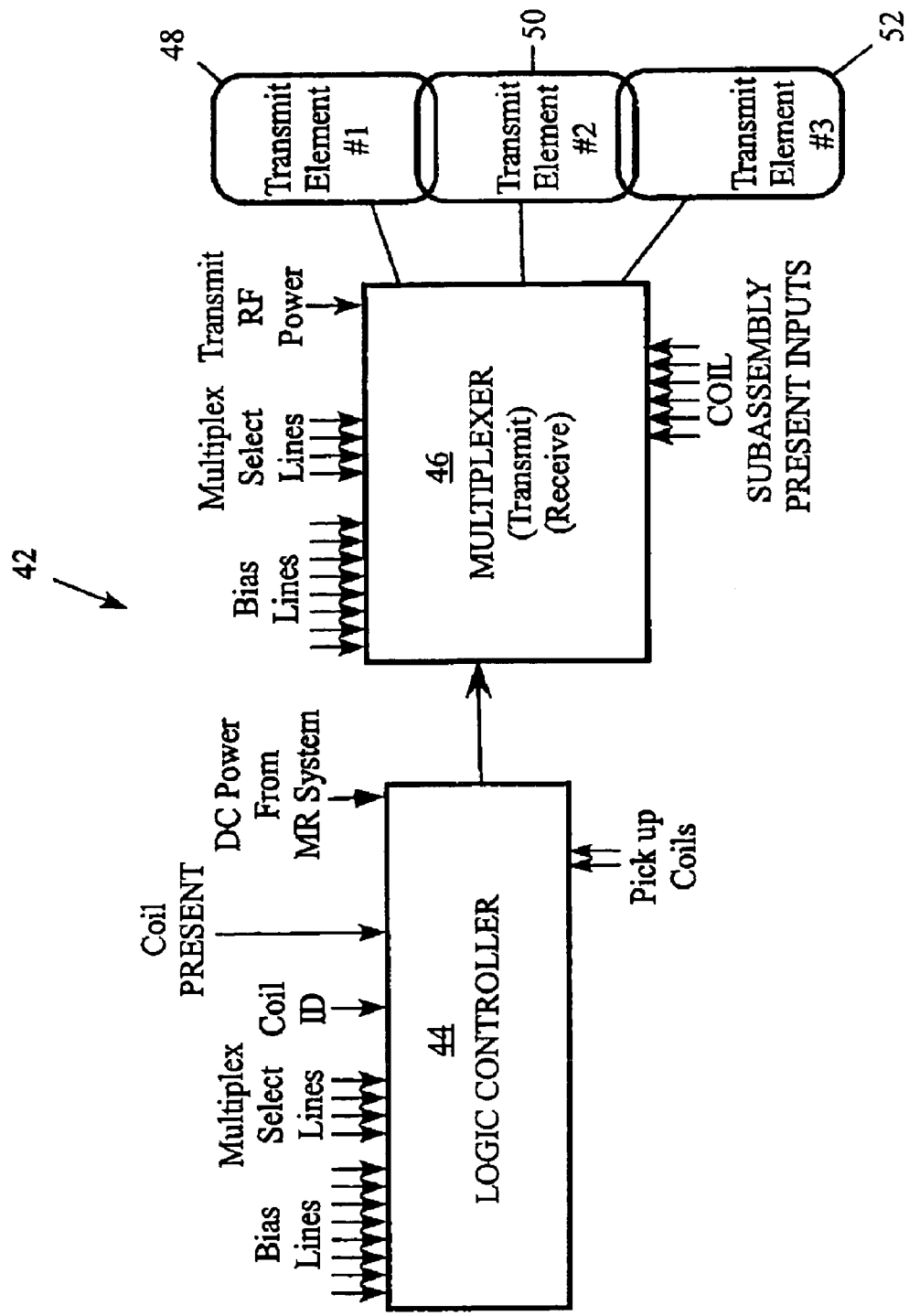
FIG. 4 depicts a partial block diagram of a coil system including a logic controller, a transmit multiplexer and three transmit coil elements according to an embodiment of the present invention.

FIG. 4 shows an exemplary coil system 42 according to an embodiment of the present invention adapted to interface with an MR scanner (with advanced features). Although described in more detail in the following example, FIG. 4 shows various components of the system 42 as well as the inputs/outputs to/from the scanner (not shown) and the coil system 42.

Generally speaking, the partial block diagram of FIG. 4 depicts a logic controller 44, a transmit multiplexer 46 and three transmit coil elements 48, 50, 52. The inputs to the logic controller 44 include various control signals from the scanner (e.g., T/R bias lines, multiplex select lines and COIL ID/COIL PRESENT signals) as well as optional positioning signals from the coil itself (e.g., pick-up coils 1, 2). The transmit multiplexer 46 receives its main input signal from the logic controller 44, but it may also receive one or more control signals from the scanner. Additionally, the transmit multiplexer 46 receives transmit RF power from the scanner (which it selectively passes onto the transmit coil elements 48, 50 and/or 52) as well as optional coil subassembly present inputs.

A function of the embodiments described herein is the ability to receive up to, for example, eight different receive inputs from up to eight different receive coil elements and a bias driver circuit having eight different individual bias drivers. Each of the bias lines can be programmed individually by the host scanner system coil configuration file for transmit-mode bias voltage, transmit-mode bias current limits and an identification of whether each bias line toggles from a transmit to a receive state (for T/R coil elements) or stays in a transmit state at all times. The system also provides four TTL multiplex select lines to communicate desired action from the host system (potentially under command from the operator) to an external MRI coil device. The port also includes a single transmit RF port producing a maximum RF power of 2,000 watts at 1.5 Tesla (64 MHz) or 4,000 watts at 3.0 Tesla (128 MHz). A 50-ohm load capable of handling the same power levels at the system duty cycle is also available.

The logic controller 44 can receive inputs of an operator's intentions from either the pattern and/or voltage levels of the eight T/R bias drivers, and/or from the four multiplex select lines providing a TTL logic level. The logic levels and/or bias voltages and patterns can be controlled via the system coil configuration file of the scanner. The file may cause specific patterns and voltage levels to be present on the T/R bias lines, and/or a specific set of logic levels on the multiplex select lines for each Coil Name selected. Thus, different Coil Names for the same device can cause different actions to take place in an external surface coil design. In this way, embodiments of the present invention are adaptable to a wide variety of existing and future MR scanners without the necessity to alter the scanner itself. Thus, embodiments of the present invention may be adapted to any selected scanner.

As taught in the '065 patent (incorporated by reference above), the logic controller 44 can also obtain inputs from other sources, such as the physical position of the coil system in the magnet bore. For example, in some current scanner systems, the gradient pulses are symmetrical about isocenter, which is the exact center of the B0 imaging magnet. Therefore, by obtaining relative amplitude information from a pair of sensors at each end of a large coil system (see the '065 patent), the position of the coil system (and each individual coil element of the coil system) with respect to the system isocenter can be determined from the information provided by the gradient waveforms picked up by the sensors at the end of the coil system.

Using the information collected above, the logic controller 44 can determine the location within the bore where the coil system is located relative to the isocenter of the magnet. Because some scanner systems normally move the patient table that contains the coil subsystem to center the imaging volume (i.e., the patient's region of interest or the portion of the body to be scanned) to coincide with the system isocenter in the Superior-Inferior direction (S-I), the logic controller 44 can cause the transmit coil elements 48, 50, 52 that are appropriate based upon position (S-I) and Field of View (FOV) in use to be operational. The logic controller 44 can then determine the size of the FOV from the Coil Name entered by the operator (which will control the four multiplexer select lines) or by the size of the gradient fields in the S-I or other direction, or by the range of transmit frequencies employed to image the desired object.

The logic controller 44 may then provide outputs which cause the appropriate transmit coil element or elements 48, 50, 52 to be activated in the coil system and which cause the RF power from the scanner to be divided into proper proportions of amplitude and phase to drive the selected appropriate transmit coil elements 48, 50, 52. The RF power is provided by the transmit RF connector in the coil port A connector 38 on current scanner systems.

As set forth above, embodiments of the present invention may be used with a variety of different scanners and may be employed in an almost limitless combination of transmit only and transmit/receive (T/R) coil elements that are combined to form one or more RF coils or coil systems. To illustrate an embodiment of the present invention that includes many of the aspects of the invention, an example of a bilateral/unilateral transmit/receive coil for peripheral vascular ("PVA") studies on a GE Health Care Signa Excite HD MRI system with level 14.0 hardware and software will now be presented. Although certain detailed features and component selections will be discussed, the identity and selection of these features is exemplary only and is not meant to limit the present invention to any features/components set forth in this embodiment.

Figure 5:
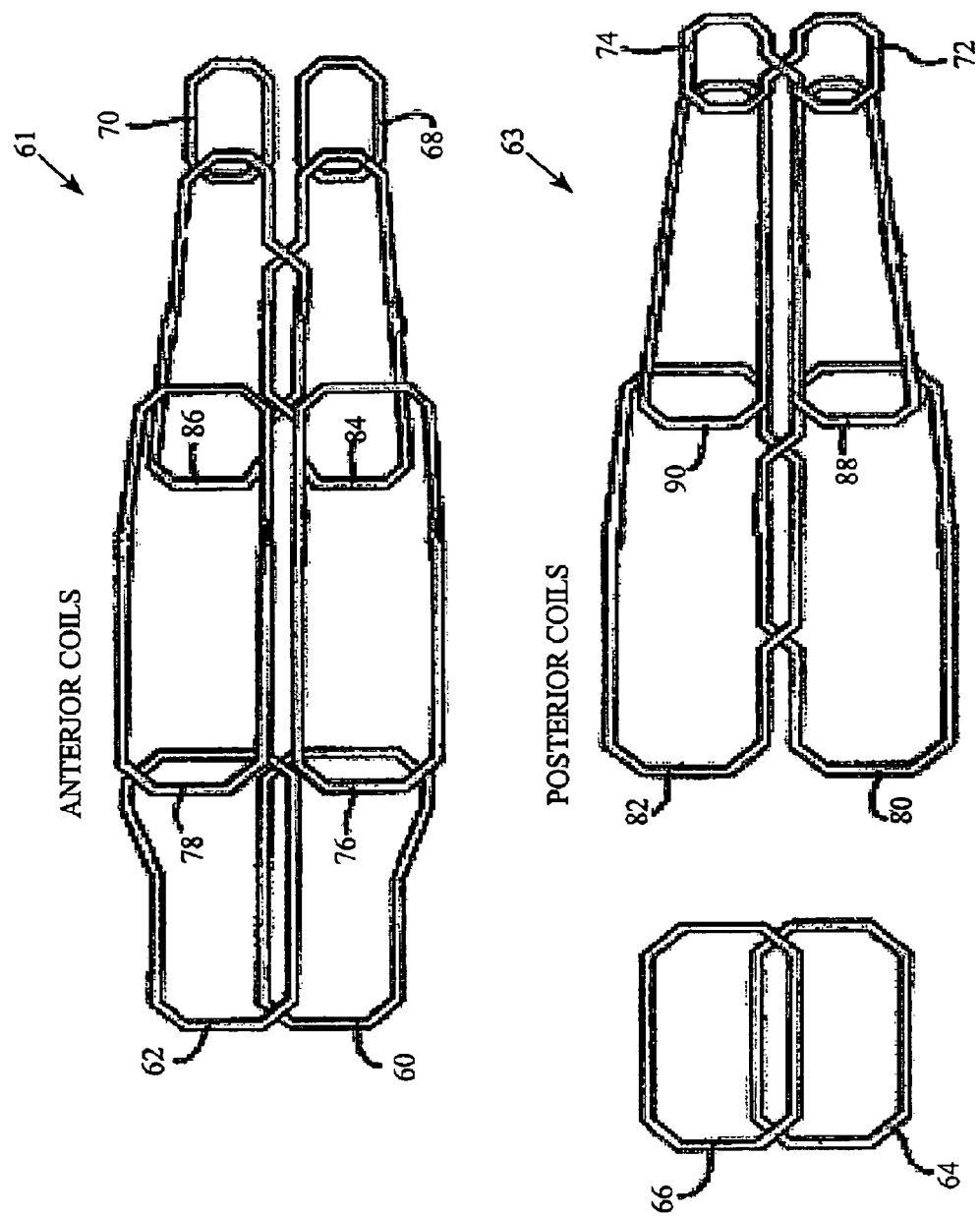
FIG. 5 details the transmit coil elements of an exemplary RF coil according to an embodiment of the present invention for peripheral vascular studies.

The coil system used in the example herein is intended to perform scans on the pelvis, thigh, calf and foot (or any subcombination thereof) of a patient. FIG. 5 shows anterior transmit coil elements 61 and posterior transmit coil elements 63 of the coil system and FIG. 6 shows anterior receive coil elements 65 and posterior receive coil elements 67 of the coil system.

Specifically, the exemplary coil system contains transmit-receive ("T/R") pelvic area coil elements 60, 62, 64, 66 and T/R foot area coil elements 68, 70, 72, 74. Thigh area coil elements 76, 78, 80, 82 and calf area coil elements 84, 86, 88, 90 are transmit coils.

The coil system includes a variety of different transmit-only and T/R coil elements. It should be apparent, however, to one skilled in the art in light of U.S. Pat. Nos. 6,040,697, 6,223,065, 6,396,273, 6,714,013 and/or 7,012,430, all incorporated by reference herein, that the coil system could use totally separate transmit and receive elements for all areas, common transmit/receive elements in all areas, or any appropriate combination of the two techniques. Also, to take advantage of some of the advanced features of various embodiments of the present invention, the exemplary coil system is described as being used with a scanner operating at 3.0 Tesla with an HD coil port and at least eight receivers.

Figure 6:
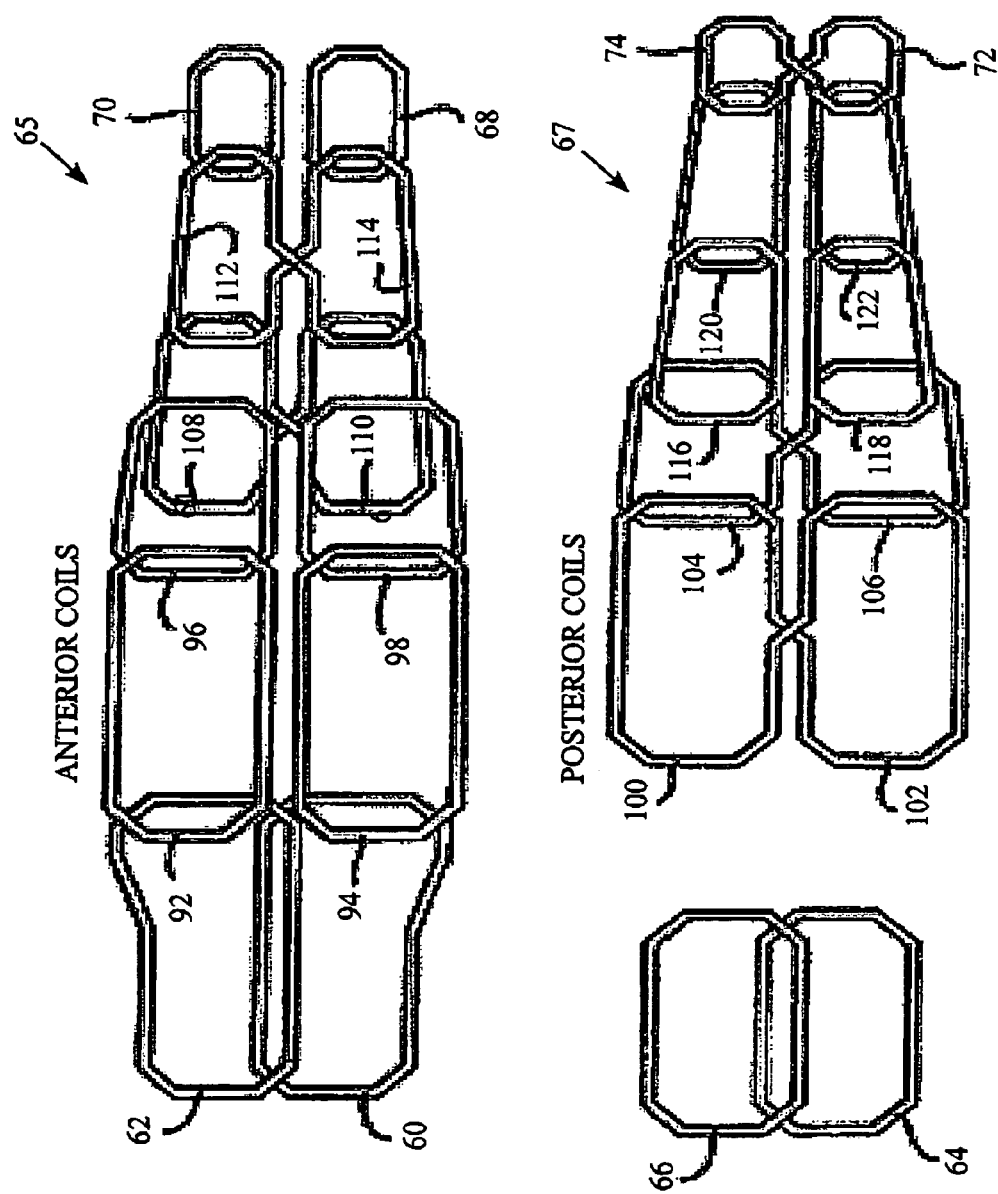
FIG. 6 details the receive coil elements of an exemplary RF coil according to an embodiment of the present invention for peripheral vascular studies.

The receive coil elements of the exemplary coil are illustrated in FIG. 6. The exemplary coil system covers from the lower aortic bifurcation to the feet. The coil system includes a large number of receive coil elements. In the example of FIG. 6, twenty-four receive coil elements are used: (1) four elements to cover the pelvis (anterior left pelvis coil 62, anterior right pelvis coil 60, posterior left pelvis coil 66, posterior right pelvis coil 64); (2) eight elements to cover the thighs (anterior superior left thigh coil 92, anterior superior right thigh coil 94, anterior inferior left thigh coil 96, anterior inferior right thigh coil 98, posterior superior left thigh coil 100, posterior superior right thigh coil 102, posterior inferior left thigh coil 104, posterior inferior right thigh coil 106); (3) eight elements cover the calves (anterior superior left calf coil 108, anterior superior right calf coil 110, anterior inferior left calf coil 112, anterior inferior right calf coil 114, posterior superior left calf coil 116, posterior superior right calf coil 118, posterior inferior left calf coil 120, posterior inferior right calf coil 122); and (4) four elements are used to cover the feet (anterior left foot coil 70, anterior right foot coil 68, posterior left foot coil 74 and posterior right foot coil 72). Using the teachings of the '065 patent and/or the Coil Name function to output a particular pattern of bias lines and/or multiplex select lines, the coil system can output the receive coil elements to eight or sixteen receivers, depending on the host system available.

The transmit coil elements of the exemplary coil system are shown in FIG. 5. Generally, the exemplary coil system contains transmit/receive coil elements in the pelvic and feet areas and separate transmit-only coil elements in the thigh and calf regions. Specifically, the transmit coil elements depicted in FIG. 5 include: (1) four transmit/receive coil elements to cover the pelvis (anterior left pelvis coil 62, anterior right pelvis coil 60, posterior left pelvis coil 66, posterior right pelvis coil 64); (2) four transmit-only elements to cover the thighs (anterior left thigh coil 78, anterior right thigh coil 76, posterior left thigh coil 82, posterior right thigh coil 80); (3) four transmit-only coil elements to cover the calves (anterior left calf coil 86, anterior right calf coil 84, posterior left calf coil 90, posterior right calf coil 88); and (4) four transmit/receive coil elements to cover the feet (anterior left foot coil 70, anterior right foot coil 68, posterior left foot coil 74 and posterior right foot coil 72).

The four pelvic elements 60, 62, 64, 66 may be used as one coil subsystem to transmit RF power for pelvic coverage. Coil elements 62 and 64 are driven 180° out of phase with each other (causing them to act as a Helmholtz Pair and create a uniform B1 RF magnetic field in the region between them), and elements 60 and 66 are driven 90° apart in phase. The lead and lag pair are set for the B0 magnet ramping of the host MRI system to provide the proper quadrature sense. Because there is no need to ever perform a unilateral scan of the pelvis and because the anatomy of interest is in the center of the region, there may be no need for the pelvic subsystem to operate in a unilateral mode.

The four thigh coil elements can form a quadrature bilateral system using a technique similar to that used in the pelvic subsystem (e.g., element pairs 78 and 80, and 76 and 82, are driven 180° out of phase to create a uniform diagonal field, and the two pairs of elements are driven 90° out of phase to create a quadrature B1 RF field). Alternatively, the region could be covered in a unilateral manner by using coil elements 78 and 82 as a Helmholtz Pair driven 180° out of phase to create a uniform field over only the left thigh of the patient, or by using coil elements 76 and 80 as a Helmholtz Pair driven 180° out of phase to create a uniform field over only the right thigh of the patient.

In a similar manner, the four calf coil elements can form a quadrature bilateral system using a methodology similar to that used in the pelvis or thighs (i.e., element pairs 86 and 88, and 84 and 90, are driven 180° out of phase to create a uniform diagonal field, and the two pairs of elements are driven 90° out of phase to create a quadrature B1 RF field). Alternatively, the region could be covered in a unilateral manner by using coil elements 86 and 90 as a Helmholtz Pair driven 180° out of phase to create a uniform field over only the left calf of the patient, or by using coil elements 84 and 88 as a Helmholtz Pair driven 180° out of phase to create a uniform field over only the right calf of the patient.

The foot coil elements may be used as a coil subsystem for each foot. A quadrature field over both feet could also be created in a manner similar to that described above for the thighs and calves. However, the anatomy of the feet may make using only coil elements 70 and 74, or coil elements 68 and 72 as pairs, with each foot treated separately. Bilateral scans of the feet could be accomplished by enabling both the left coils 70, 74 and right coils 68, 78 simultaneously.

The above-described exemplary coil system may be used to perform a variety of different scan procedures. However, because an embodiment of the invention is a transmit-mode intelligent phased array system, this example focuses primarily on the transmit-mode operation of the device. It will be understood by one skilled in the art that, especially in light of the '065 patent, the receive coil elements can be selected and used in an intelligent manner to maximize the resulting image quality, and that the elements to do this can be incorporated within the elements of the present figures.

The complete coil system of FIGS. 5 and 6 can be used to advantage in a variety of different modes. For example, the presently-configured coil system would be advantageous for performing pelvic scans of the aortic bifurcation. For this mode, transmit/receive coil elements 62, 64, 60, 66 would be used for both transmit and receive functions. The four coil elements 62, 64, 60, 66 may work as a single coil subsystem in transmit mode (as described above) and as four separate coil elements driving four separate receivers in the receive mode.

Figure 7:
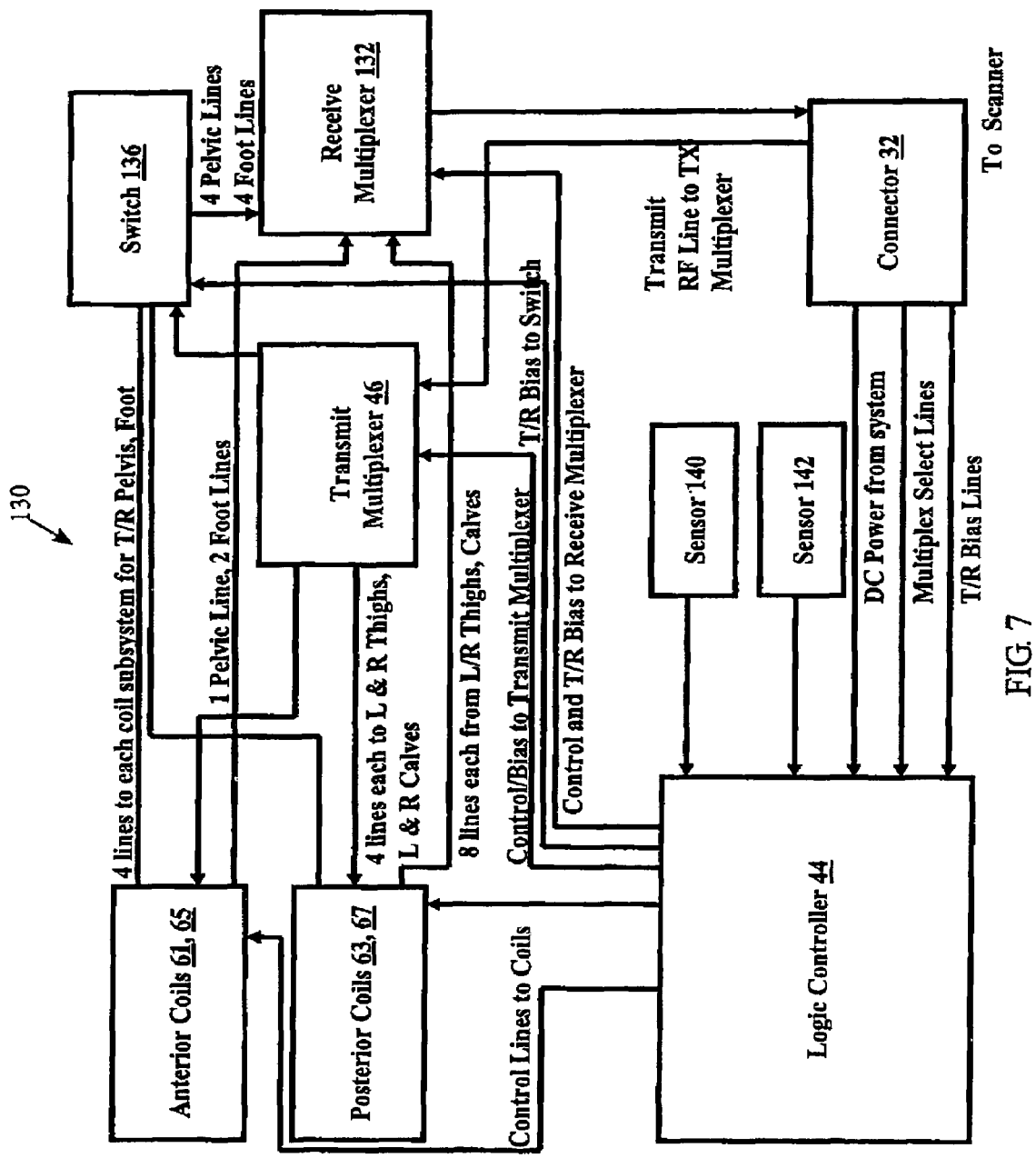
FIG. 7 details a block diagram of an exemplary bilateral/unilateral transmit/receive coil system for peripheral vascular studies according to an embodiment of the present invention.
Figure 8:
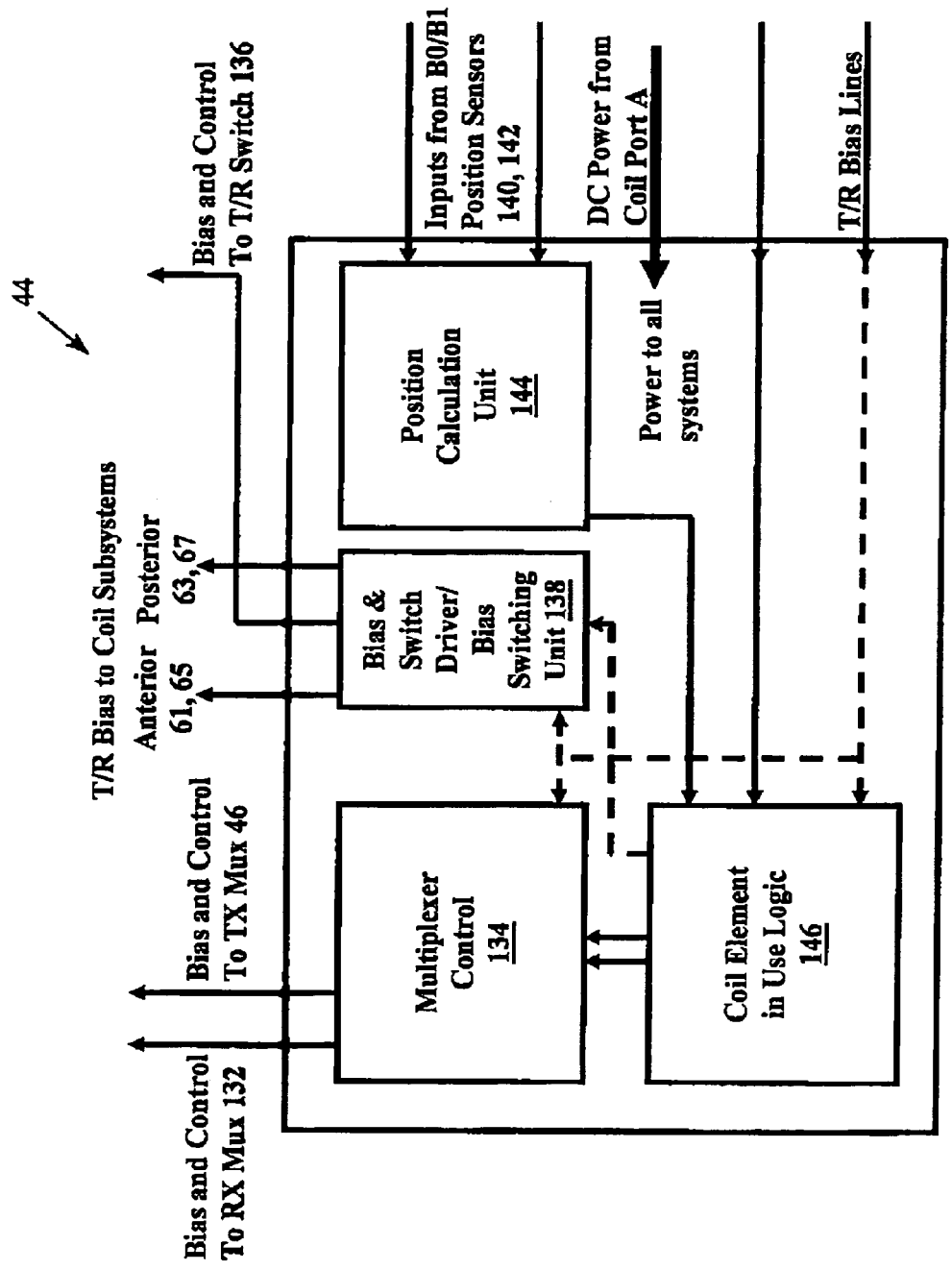
FIG. 8 is a block diagram of a logic controller for use with an exemplary bilateral/unilateral transmit/receive coil system for peripheral vascular studies according to an embodiment of the present invention.

FIG. 7 details a block diagram of an exemplary bilateral/unilateral transmit/receive coil system 130 for peripheral vascular studies according to an embodiment of the present invention and FIG. 8 is a block diagram of the logic controller 44 for use with the system 130 of FIG. 7. The mode in which the transmit/receive coil elements 62, 64, 60, 66 are used for both transmit and receive functions and work as a single coil subsystem in transmit mode and as four separate coil elements driving four separate receivers in the receive mode, may be automatically selected by the logic controller 44 driving the transmit multiplexer 46, a receive multiplexer 132 via a multiplexer control 134, and a T/R switch 136 via bias and T/R switch driver unit 138 when superior field sensor 140 and inferior field sensor 142 provide inputs to the logic controller 44 via a position calculation unit 144.

In a similar fashion, bilateral scans of the peripheral vascular system could be run using the exemplary coil system of FIGS. 5 and 6. Depending upon the position of the patient in the scanner bore and the field of view in use, the coil system could be used to image the thighs, the pelvis and thighs, the calves, the thighs and calves, the feet, and/or the calves and feet. Generally speaking, these various scans can be performed by using the various multiplexers to select and provide RF power to those coil elements that cover the intended regions of interest.

For example, to cover the thighs, transmit coil elements 78, 80, 76, 82 can be used as one coil subsystem and receive elements 92, 94, 96, 98, 100, 102, 104, 106 can be used to drive eight different receivers. Similarly, in order to expand this mode to cover both the pelvis and the thighs, T/R elements 62, 64, 60, 66 are added as a second transmit coil subsystem (to cover the pelvis), and these same T/R coil elements are added to the above-described eight "thigh" receive elements in the receive mode. The combined twelve receive coil elements may be used to drive twelve different receivers (if available on the scanner) or the twelve signals may be multiplexed down to eight receivers by combining coil elements 62 and 64, 60 and 66, 92 and 102, and 94 and 100. Through this combination, a wider variety of MR scanners may be utilized with embodiments of the present invention.

Other groups of coil elements could be combined for additional coil subsystems. For example, a calf subsystem could utilize transmit elements 86, 88, 84 and 90 as a transmit subsystem and receive elements 108, 110, 116, 118, 112, 114, 120 and 122 to drive eight different receivers. Likewise, a feet subsystem could be created using T/R coil elements 70, 68, 74 and 72 as a transmit subsystem and using the same coil elements in the receive mode to drive four receivers. Combinations of these subsystems (e.g., "calves and feet" or "thighs and calves") can be put together by using two or more different coil subsystems as part of the same mode. As described above with respect to the pelvis and thigh mode, depending on the number of available receivers, the receive coil elements may separately drive receivers or may be multiplexed down until there is an appropriate number of receive signals for the scanner that is being utilized for the procedure.

In addition to the bilateral scans described above, the present exemplary coil system may be used to carry out a variety of different unilateral scans. For unilateral scans, the coils used will depend upon the patient position within the scanner, the field of view in use, and the side of the body (left or right) that is to be studied. Below, the left side is used as an example, but the right side can be studied by substituting the appropriate coil elements from the right side for the selected elements from the left side.

Some unilateral scan modes that are suitable for the present exemplary coil include, for example: left thigh; pelvis and left thigh; left calf; left thigh and calf; left foot; and left calf and foot. The groupings of the transmit (FIG. 5) and receive (FIG. 6) coil elements are the same as those described above with respect to the bilateral modes, except that only the appropriate half of the coil elements (left or right) are utilized when a unilateral scan is undertaken. Other than this change, the above discussion can be extended by those skilled in the art to cover all permutations of unilateral scans that correspond to this discussion.

The above discussion detailed an exemplary coil system and a variety of different bilateral and unilateral modes that may be addressed using such a coil. The present discussion will detail how an exemplary logic controller may be used to control such a coil using input signals from the scanner, external sensors and even the coil system itself.

The selection of the proper transmit (and receive) coil elements (or coil element subsystems) is done by two primary inputs. The first is the Coil Name selected by the operator, and the second is the position of the coil system in the host MRI machine bore which indicates the area which is available to scan. For this application, the operator may select "LEFT PV," "RIGHT PV," or "BILATERAL PV" as potential Coil Names for the scanner configuration file. The selection of the coil name will inform the coil, through either the patterns of the bias lines or through the states of the multiplexer select lines from the MR system whether the operator has selected LEFT, RIGHT or BILATERAL PV scanning. The logic controller can optionally also receive information as to the region to be scanned from more specific Coil Names, although this additional information may be unnecessary in some applications.

The two B0/B1 field sensors 140, 142 measure the static B0 magnetic field, the B1 gradient field amplitude and sign, or the B1 RF field magnitude. By knowing the information about the B1 and/or B0 fields, the position of the coil system in the bore can be determined by the position calculation unit 144 working with coil element in use logic 146. This calculation will allow the coil element in use logic 146 to determine which coil elements (transmit and/or receive and/or transmit-receive) are appropriate to scan the anatomy to be imaged. An optional input may include a set of coil names for large or small fields of view. This optional input could be used to determine if a single section of the coil set (in the superior-inferior direction) or if two adjacent sections are appropriate to cover the anatomy in question.

The coil element in use logic 146 then determines, using, for example, a look-up table or other data retrieval method, which coil elements to use to transmit RF power into and receive data from the patient. In this way, only the needed transmit coil elements are in operation, thus reducing the whole-body specific absorption rate (SAR). Also, this methodology provides freedom from aliasing and other artifacts caused by transmit excitation of anatomy outside of the region to be scanned.

The tasks of selecting (and/or when necessary combining) the transmit and/or transmit/receive coil elements to provide a uniform transmit field is handled by the transmit multiplexer 46. In those embodiments in which two or more transmit (and/or T/R) coil elements are deployed in a phased array configuration, high transmit field uniformity can be achieved using the techniques disclosed and claimed in U.S. Pat. No. 7,012,430. If T/R coil elements are used, then the T/R switch 136 is used to switch the mode of the coil from transmit to receive (and back), and the receive multiplexer 132 may be used if the number of receive elements being used is greater than the number of receivers that the MR scanner can accept. The two multiplexers 46, 132 obtain instructions from the multiplexer control 134 based upon outputs from the coil elements in use logic 146. The multiplexer control 134 enables the needed coil elements for coil position in the bore and left, right, or bilateral coil name selection. In one embodiment, the multiplexer control 134 and the coil elements in use logic 146 are subcomponents of the logic controller 44. Appropriate bias to control the various coil elements between the modes of transmit, receive, and "off" is provided by the eight T/R bias lines from the host GEHC Signa MR scanner (not shown) and/or other power sources such as the +15 VDC and −15 VDC.

Various embodiments of the present invention may be used with any type of coil system, such as, for example, those used to image the brain (e.g., head coils, birdcage coils, etc.), the vascular system, the torso, the spine, bones and joints, the abdomen, the pelvis, etc.

Various embodiments of the present invention may be implemented on computer-readable media. The terms "computer-readable medium" and "computer-readable media" in the plural as used herein may include, for example, magnetic and optical memory devices such as diskettes, compact discs of both read-only and writeable varieties, optical disk drives, hard disk drives, etc. A computer-readable medium may also include memory storage that can be physical, virtual, permanent, temporary, semi-permanent and/or semi-temporary. A computer-readable medium may further include one or more data signals transmitted on one or more carrier waves Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered only to facilitate comprehension of the invention and should not be construed to limit the scope thereof.

What is claimed is:

1. A local coil system for use with a magnetic resonance imaging system, the magnetic resonance imaging system including a scanner, the local coil system comprising:
    (a) a plurality of coil elements, each of the coil elements covering at least partially a different portion of a patient; and
    (b) a controller in communication with the scanner, wherein the controller is configured to selectively control transmission of a radio frequency (RF) signal provided by the magnetic resonance imaging system to at least one of the plurality of coil elements during a transmit cycle of the magnetic resonance system in response to at least one signal from the scanner.

2. The local coil system of claim 1, wherein the at least one signal originates from activation of a coil configuration file within the scanner.

3. The local coil system of claim 1, wherein at least one of the plurality of coil elements is a transmit-receive coil element.

4. The local coil system of claim 1, wherein at least one of the plurality of coil elements is a transmit only coil element.

5. The local coil system of claim 1, further comprising a multiplexer in communication with the controller, wherein the multiplexer is configured to selectively apply the RF signal from the scanner to one or more of the plurality of coil elements as commanded by at least one of the controller and the magnetic resonance imaging system.

6. The local coil system of claim 1, wherein the at least one signal is a bias signal from the scanner that provides an indication of a coil attribute selected by an operator of the scanner.

7. The local coil system of claim 6, wherein the indication of a coil attribute is encoded in the bias signal as one of a plurality of voltages and a pattern of logic levels.

8. The local coil system of claim 1, further comprising a sensor for measuring an operating parameter of the scanner and providing information indicative thereof to the controller for use thereby along with the at least one signal from the scanner.

9. The local coil system of claim 8, wherein the sensor is configured to measure at least one of a static B0 magnetic field, a B1 gradient field amplitude, and a B1 gradient field sign.

10. The local coil system of claim 1, further comprising a receive coil element multiplexer in communication with the controller.

11. The local coil system of claim 1, wherein the controller includes a position calculation unit and coil element in use logic.

12. The local coil system of claim 1 wherein the controller determines a phase and an amplitude of the RF signal to be transmitted for each of the plurality of coil elements selected so as to optimize uniformity of a B1 RF field created thereby.

13. A local coil system for use with a magnetic resonance (MR) system, the local coil system comprising:
(a) a plurality of coil elements;
(b) at least one sensor for providing information indicative of position of the plurality of coil elements relative to isocenter of the MR system;
(c) a multiplexer having a transmit multiplexing unit and being operatively connected to the plurality of coil elements; and
(d) a logic controller in communication with the MR system and the multiplexer, the logic controller for selecting which coil element(s) from the plurality shall receive a radio frequency (RE) signal and computing a control signal representative thereof based at least in part on the information received from the at least one sensor;
wherein the multiplexer is configured to selectively apply the RF signal obtained from the MR system during the transmit cycle thereof to a desired number of the plurality of coil elements in response to the control signal received from at least one of the logic controller and the MR system.

14. The local coil system of claim 13, wherein the at least one sensor is used to measure at least one of a static B0 magnetic field, a B1 gradient field amplitude, and a B1 gradient field sign.

15. The local coil system of claim 13 further comprising a sensor for measuring an operating parameter of the scanner and providing information indicative thereof to the logic controller for use in determining the control signal.

16. The local coil system of claim 13, wherein the control signal is provided by the MR system via at least one multiplex select line.

17. The local coil system of claim 13, wherein the control signal originates from activation of a coil configuration file within the MR system.

18. The local coil system of claim 13, wherein at least one of the plurality of coil elements is a transmit-receive coil element.

19. The local coil system of claim 13, wherein at least one of the plurality of coil elements is a transmit only coil element.

20. The local coil system of claim 13, wherein the control signal is a bias signal from the MR system that provides an indication of a coil attribute selected by an operator of the MR system.

21. The local coil system of claim 20, wherein the indication of a coil attribute is encoded in the bias signal as a plurality of voltages.

22. The local coil system of claim 20, wherein the indication of a coil attribute is encoded in the bias signal as a pattern of logic levels.

23. The local coil system of claim 13, wherein the multiplexer further includes a receive multiplexing unit for use at least when the MR system has fewer receivers than there are receive coil elements in the plurality of coil elements.

24. The local coil system of claim 13 wherein one of the logic controller and the multiplexer determines a phase and an amplitude of the RF signal to be transmitted for each of the desired number of the plurality of coil elements selected so as to optimize uniformity of a B1 RF field created thereby.

25. A method of selectively controlling transmission of a radio frequency (RF) signal to at least one of a plurality of coil elements, the method comprising:
(a) receiving a signal from a magnetic resonance (MR) scanner;
(b) generating a control signal that is used to control selection of a desired number of the plurality of coil elements that is to receive the RF signal, wherein the generating is based on the signal from the MR scanner; and
(c) multiplexing the RF signal to the desired number of the plurality of coil elements during a transmit cycle of the MR scanner in accordance with the control signal.

26. The method of claim 25, further comprising sensing a position of at least one of the plurality of coil elements within a bore of the MR scanner and generating the control signal based on the signal from the MR scanner and the sensed position.

27. The method of claim 25, further comprising:
generating a second control signal; and
selectively enabling receipt of a magnetic resonance signal from at least one of the plurality of coil elements based on the second control signal.

28. The method of claim 27, further comprising sensing a position of at least one of the plurality of coil elements within a bore of the MR scanner and generating the second control signal based on the sensed position.

29. The method of claim 25, further comprising multiplexing a plurality of received magnetic resonance signals from the plurality of coil elements and communicating the multiplexed plurality of received magnetic resonance signals to the MR scanner.

30. The method of claim 25, further comprising the step of determining a phase and an amplitude of the RF signal to be transmitted for each of the desired number of the plurality of coil elements selected in accordance with the control signal so as to optimize uniformity of a B1 RF field created thereby.

31. A local coil system for use with a magnetic resonance imaging system, the magnetic resonance imaging system including a scanner, the local coil system comprising:
(a) a plurality of coil elements;
(b) means for receiving a signal from the scanner;
(c) means for generating a control signal that is used to control selection of a desired number of the plurality of coil elements that is to receive from the scanner a radio frequency (RF) signal, wherein the generating is based on the signal from the scanner; and
(d) means for multiplexing the RF signal to the desired number of the plurality of coil elements during a transmit cycle of the scanner in accordance with the control signal.

32. The local coil system of claim 31, wherein at least one of the plurality of coil elements is one of a transmit-receive coil element and a transmit only coil element.

33. A computer-readable medium having stored thereon instructions which, when executed by a processor, cause the processor to:
   (a) receive a signal from a magnetic resonance (MR) scanner;
   (b) generate a control signal that is used to control selection of a desired number of a plurality of coil elements that is to receive a radio frequency (RF) signal, wherein the generation is based on the signal from the MR scanner; and
   (c) command a multiplexer to apply the RF signal to the desired number of the plurality of coil elements in accordance with the control signal during a transmit cycle of the MR scanner.

34. The computer-readable medium of claim 33, further including instructions to cause the processor to: determine a phase and an amplitude of the RF signal to be transmitted for each of the desired number of the plurality of coil elements selected in accordance with the control signal so as to optimize uniformity of a B1 RF field created thereby.

* * * * *